United States Patent [19]

Kohda et al.

[11] Patent Number: 5,107,313
[45] Date of Patent: Apr. 21, 1992

[54] FLOATING GATE TYPE SEMICONDUCTOR MEMORY DEVICE

[75] Inventors: Kenji Kohda; Tsuyoshi Toyama; Nobuaki Andoh; Kenji Noguchi; Shinichi Kobayashi, all of Hyogo, Japan

[73] Assignee: Mitsubishi Denki Kabushiki Kaisha, Tokyo, Japan

[21] Appl. No.: 254,234

[22] Filed: Oct. 6, 1988

[30] Foreign Application Priority Data

Oct. 21, 1987 [JP] Japan .................... 62-267183

[51] Int. Cl.$^5$ .............................. H01L 29/78
[52] U.S. Cl. ............................ 357/23.5; 357/41; 357/45; 357/52; 357/55; 357/23.11
[58] Field of Search ............ 357/23.5, 23.11, 41, 357/45, 52, 55

[56] References Cited

U.S. PATENT DOCUMENTS 4,872,041 10/1989 Sugiura et al. .................... 357/23.5

OTHER PUBLICATIONS

T. Costlow, "Processing Technique Brings EEPROM to Standard Cells", *Electronic Design* (Oct. 17, 1985), pp. 41 and 42.
Electronics: "E-PROMS Graduate to 256-K Density with Scaled N-Channel Process" by M. Van Buskirk et al, Feb. 24, 1983, pp. 4-113-4-117.

*Primary Examiner*—Edward J. Wojciechowicz
*Attorney, Agent, or Firm*—Lowe, Price, LeBlanc and Becker

[57] ABSTRACT

An EPROM as a nonvolatile semiconductor memory device includes a semiconductor substrate 1, a gate oxide layer 3 formed on the surface of the semiconductor substrate 1, a plurality of floating gates 4a and 4b formed on the gate oxide layer 3 so as to overlap one another at the portions 4ab thereof with a gate oxide layer 14 sandwiched between the overlapping portions 4ab, and control gate strips 5 formed on a gate oxide layer 6 which overlies the floating gates 4a and 4b.

1 Claim, 10 Drawing Sheets

FLOATING GATE TYPE SEMICONDUCTOR MEMORY DEVICE

BACKGROUND OF THE INVENTION

1. Field of the Invention

This invention generally relates to semiconductor memory devices, and more particularly to a nonvolatile semiconductor memory device such as erasable and programmable read only memory (EPROM).

2. Description of the Prior Art

EPROMs as the nonvolatile semiconductor memory device are well known, and the structure of the EPROM cell, the arrangement of EPROM cells into a memory array and other related basic concepts are described, for example, in an article entitled "E-PROMs graduate to 256-K density with scaled n channel process" by M. Van Buskirk et al (Electronics, Feb. 24, 1983). FIG. 1 shows in block diagram the general arrangement of a typical prior art EPROM. As shown, the EPROM includes a memory array formed of a plurality of memory cells for storing data, an address buffer for selecting input addresses, X and Y decoders connected to the address buffer. The EPROM also includes an interface section having a sense amplifier and a program circuit connected to input and output buffers.

FIG. 2 shows an arrangement of the memory array of FIG. 1. A plurality of data storing memory cells are provided at the intersections or junctions of word lines $WL_1$-$WL_n$ and bit lines $BL_1$-$BL_m$. As can be seen in FIG. 2, the word lines $WL_1$-$WL_n$ are connected to the X decoder, while the bit lines $BL_1$-$BL_m$ are connected to the Y-Gate transistors. Y-Gate transistors are connected to the Y decoder. The memory cells thus provided at the intersections of the word lines and bit lines form the memory array.

Now to briefly describe the operation, input address signals comprising row address signals and column address signals are fed through the address buffer to the X and Y decoders where the address signals are decoded to provide appropriate word line selection signals and bit line selection signals. The word line selection signal defines a word line to be selected, while the bit line selection signal defines a bit line to be selected. When one of the word lines and one of the bit lines are selected, data that has been stored in the memory cell at the intersection of the selected word line and the selected bit line is sensed or read out and it is amplified by the sense amplifier, after which the read out data is retrieved through the buffer.

FIG. 3 is a fragmentary plan view showing the construction of a typical prior art EPROM cell array. FIG. 4 is a cross-section taken along the line IV—IV of FIG. 3, and FIG. 5 is a cross-section taken along the line V—V of FIG. 3. Referring to these figures, there are formed on a semiconductor substrate 1 a plurality of field oxide layers 2 spaced away from one another. There are also formed gate oxide layers 3 to extend in a direction along the line IV—IV. Floating gates 4 are provided spaced apart from one another on the gate oxide layer 3. Another set of gate oxide layers 6 cover the floating gates 4 over the semiconductor substrate 1. On each of the gate oxide layers 6, a control gate strip 5 extends in the row direction of the memory array, that is, in a direction along the line IV—IV. Each control gate strip 5 includes a plurality of control gates and interconnects them to one another. An insulating layer 7 disposed on the semiconductor substrate 1 covers the elongated control gate strips 5. A plurality of metal conductor strips or lines 11 are formed spaced apart from one another along the line V—V on the insulating layer 7. As can be seen in FIG. 5, drain region 8 and source region 9 of the memory cell are alternately formed in the surface areas of the semiconductor substrate 1 between adjacent floating gates 4. The drain region 8 is electrically connected to the metal conductor strip 11 at a contact hole 10. As shown in FIG. 3, the drain region 8 is produced in the surface area surrounded by the field oxide layers 2 and the control gate strips 5. On the other hand, the source region 9 is formed to extend between adjacent control gate strips 5 along the line IV—IV. A coating 12 of glass (oxide layer) covers the metal conductor strips 11.

FIGS. 6A-6D and FIGS. 7A-7D illustrate in partial cross-section successive stages in the process for manufacturing the prior art EPROM shown in FIGS. 3, 4 and 5. FIGS. 6A-6D are cross-sectional views taken along the line IV—IV of FIG. 3, and FIGS. 7A-7D are cross-sectional views taken along the line V—V of FIG. 3.

Referring now to FIGS. 6A and 7A, field oxide layers are first formed on a P-type semiconductor substrate 1 to line up along the line IV—IV of FIG. 3 and are spaced FIG. 3 by using selective thermal oxidation techniques. Then gate oxide layer 3 is applied to cover the entire surface of the semiconductor substrate 1 including the field oxide layers 2. A layer of polycrystalline silicon (not shown) is deposited over the gate oxide layer 3 by, for example, chemical vapor deposition (CVD), and the polysilicon layer is selectively removed by dry etching in the areas over the field oxide layers 2 to leave portions 4 which will be formed into floating gates in the subsequent step.

In the step of FIGS. 6B and 7B, a second gate oxide layer 6 is first grown by CVD, and then a polysilicon layer (not shown) is deposited on this gate oxide layer. A layer 13 of photoresist having a predetermined pattern layout is applied over the polysilicon layer, and using the photoresist layer as a mask, selective etching is performed to form control gate strips 5. At the same time, separate floating gates 4 are formed in self-alignment manner (as can be more clearly seen in FIG. 7C).

Now in FIGS. 6C and 7C, after stripping the photoresist layer 13, arsenic ions are implanted in the direction indicated by the arrows with control gate strips 5 masking the implant, thereby forming N-type drain region 8 and N-type source regions 9 in the surface of the semiconductor substrate 1.

In FIGS. 6D and 7D, an insulating layer 7 is grown by chemical vapor deposition and contact holes 10 are made in the insulating layer at locations above drain regions 8 by dry etching. A metal conductor layer 11 is formed and patterned on the insulating layer 7 and it connects to drain regions 8 through contact holes 10. Finally, the substrate structure is covered by the glass coating 12 to produce an EPROM cell shown in FIGS. 3-5.

With the EPROM cell thus manufactured, when drain regions 8 and control gate strips 5 are kept at a high potential level, and the source region 9 is kept at a ground potential level, hot electrons produced in the channel region between the drain regions 8 and the source region 9 are injected into the floating gate 4. As a result, a data "0" is written and stored in the cell. When the memory cell is exposed to UV light, the electrons accumulated in the floating gate 4 are excited and discharged. As a result, the stored data "0" is erased (a data "1" is stored).

As shown in the graphic representation of FIG. 8, the threshold voltage $V_{TH}$ of the memory transistor in the EPROM cell during the data writing cycle differs from the threshold voltage during the erasure circle. By setting the control gate voltage $V_R$ for the data read out at a value midway between the threshold voltage during the writing cycle and the threshold voltage during the erasure circle, a nonvolatile read-out of data can be done. In FIG. 8, $I_D$ indicates a drain current, and $V_G$ indicates a control gate voltage.

As discussed hereinabove, in the prior art EPROM, the floating gates 4 are formed to lie side by side directly under the control gate strip 5 by selectively etching away the polysilicon layer. In this connection, it should be noted that the adjacent floating gates 4 must be horizontally and laterally spaced away from one another over the field oxide layer 2 in order to electrically isolate them. This has been done by using photoresist masking and etching. A layer of photoresist is coated over the polysilicon layer, leaving areas between adjacent floating gates exposed. Then the exposed areas of the polysilicon are etched away, thus providing an appropriate horizontal spacing or gap between the adjacent floating gates. The length or size of this horizontal inter-gate spacing depends on the resolution of both the photoresist and etching, and spacing can not be made smaller than this resolution. In memory devices currently manufactured on the mass production basis, the inter-gate spacing is in the order of 1.5 μm. It has been necessary to provide this inter-gate spacing in order to electrically isolate adjacent floating gates, but the presence of such an inter-gate spacing is not desirable in terms of the existing need for a high density, high integrity memory device. Therefore, it is preferable if inter-gate spacing can be successfully eliminated without impairing the performance of the memory device.

SUMMARY OF THE INVENTION

This invention has been made to overcome the problems mentioned above and the object of this invention is to provide a semiconductor memory device having a structure which permits an improved memory cell density.

Briefly described, the semiconductor memory device of this invention includes a first insulating layer formed on the major surface of a semiconductor substrate of one conductivity type. On this first insulating layer, a plurality of first conductor layers are provided such that they overlap at least partially one another with an insulating material interposed therebetween. The first conductor layers are covered by a second insulating layer, upon which a second conductor layer is formed.

According to a preferred embodiment of the invention, the first insulating layer comprises a plurality of spaced apart insulating layers. Semiconductor regions are formed in the semiconductor substrate between the insulating layers and have a conductivity type opposite to that of the semiconductor substrate. The first insulating layer may include insulating portions to isolate the semiconductor regions from one another. The first conductor layers may be formed to have portions thereof overlap over the insulating portions. The semiconductor memory device may include a plurality of semiconductor elements which are isolated by these insulating portions. The semiconductor elements may be field effect transistor elements, and the semiconductor regions may form some of the field effect transistor elements. The field effect transistor elements may comprise a insulated gate and first and second electrodes formed spaced apart in the semiconductor substrate surface below an isolated gate. The semiconductor regions preferably may comprise the first and second electrodes, and the portion of the semiconductor substrate between the first and second electrodes defines a channel region. The isolated gate may comprise the second conductor layer, and the first conductor layers may form a floating gate. The semiconductor memory device in accordance with this invention may comprise at least an EPROM as a nonvolatile semiconductor memory device.

Also in the method for manufacturing a semiconductor memory device in accordance with this invention, a first insulating layer is provided on the major surface of a semiconductor substrate. On this first insulating layer, a plurality of first conductor layers are formed so that portions thereof overlap one another with an insulating material sandwiched between them. The first conductor layers are covered by a second insulating layer, upon which a second conductor layer is formed.

According to a preferred embodiment of the method of this invention, the first conductor layer is provided by forming a plurality of spaced apart conductor layers on the first insulating layer and then forming another plurality of conductor layers between the adjacent spaced apart conductor layers so that they partially overlap one another with an insulating material being sandwiched between them.

In the semiconductor memory device in accordance with this invention, the plurality of first conductor layers formed under the second conductor layer are arranged to overlap at least partially one another, keeping some vertical space or gap between the overlapped portions of the conductor layers. An insulating material fills the vertical spacing to ensure electrical insulation between adjacent first conductor layers. Thus, horizontal spacing found in the prior art memory device is effectively eliminated according to this invention. The elimination of the horizontal spacing reduces the overall memory cell size or area which permits a higher cell density in the memory device.

These objects and other objects, features, aspects and advantages of the present invention will become more apparent from the following detailed description of the present invention when taken in conjunction with the accompanying drawings

DETAILED DESCRIPTION OF THE PREFERRED EMBODIMENTS

Figure 1:
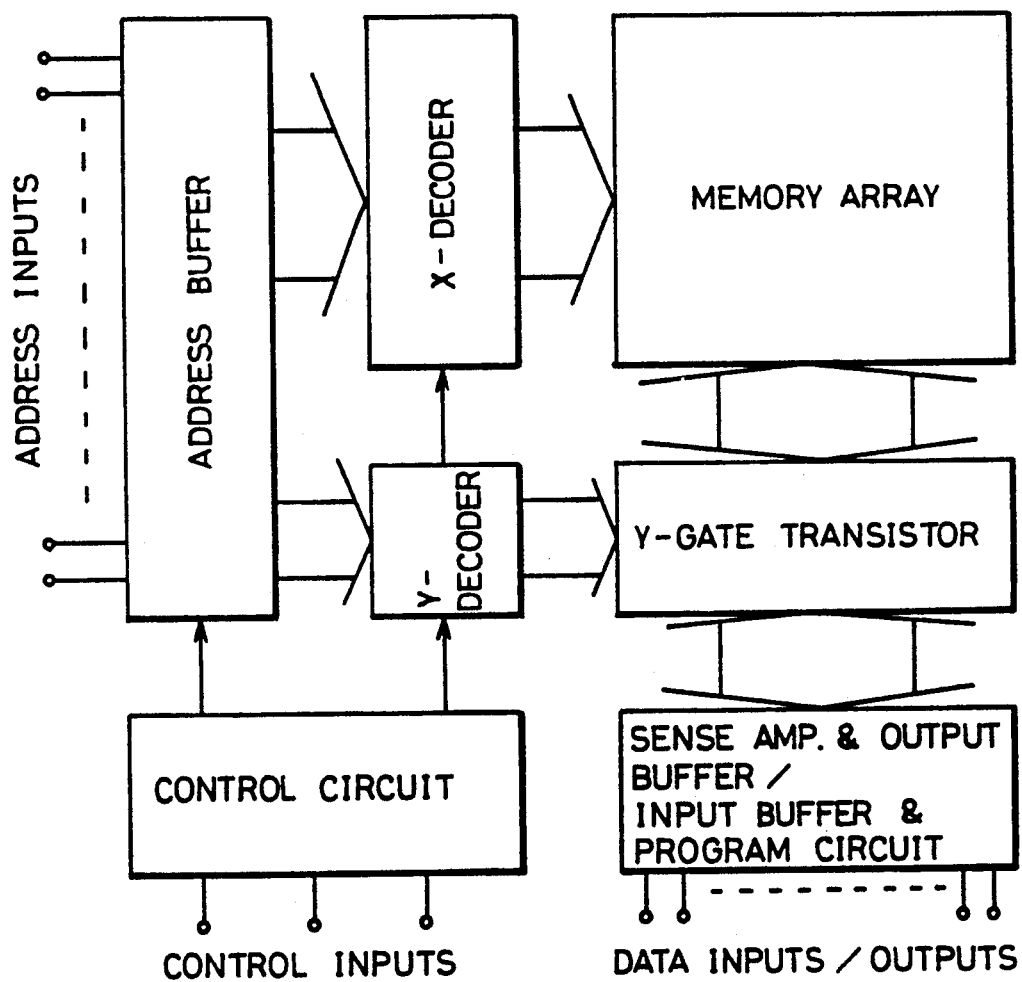
FIG. 1 is a block diagram schematically showing the overall structure of a typical EPROM as a nonvolatile semiconductor memory device.
Figure 2:
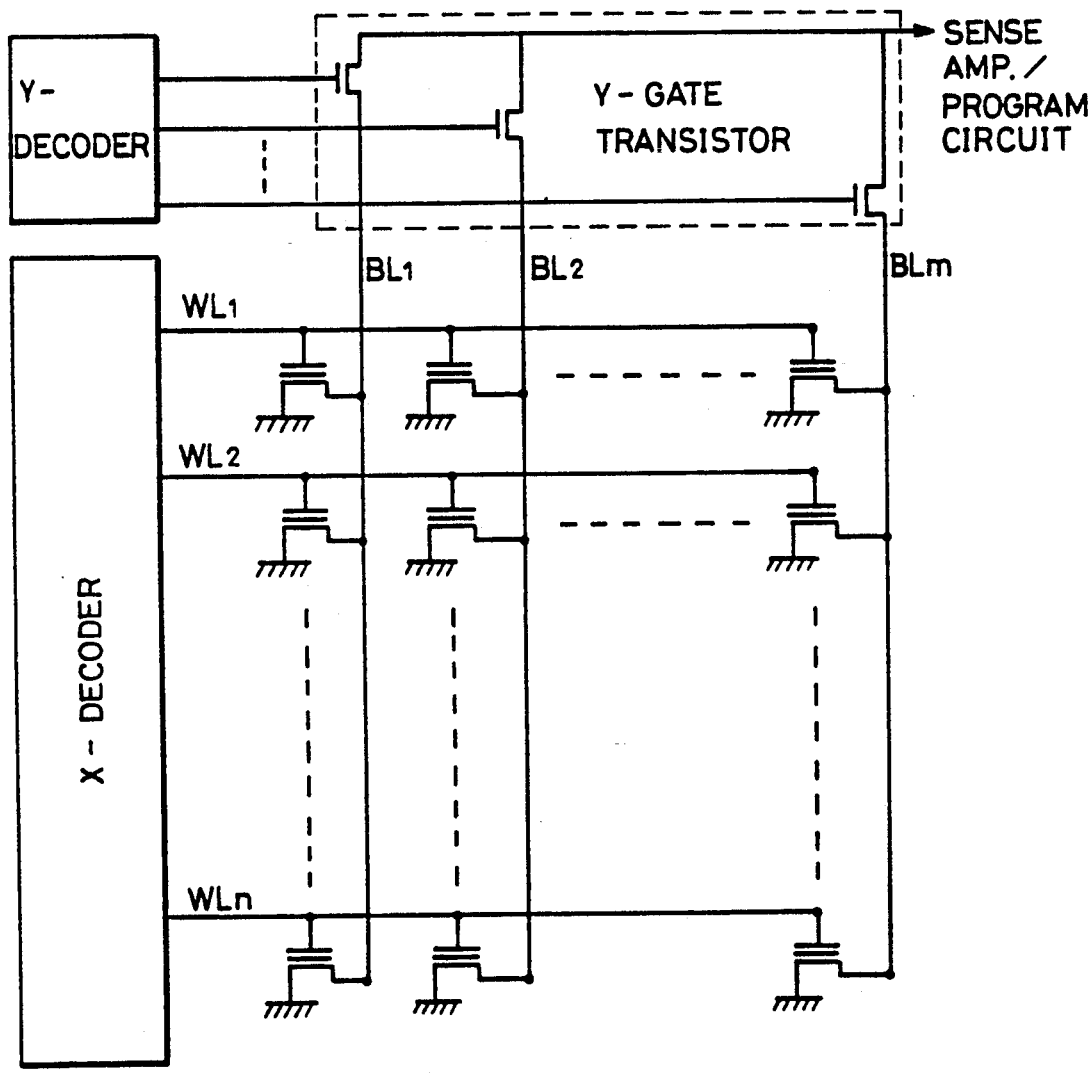
FIG. 2 is a schematic representation showing the structure of the memory cell array of the EPROM of FIG. 1.
Figure 3:
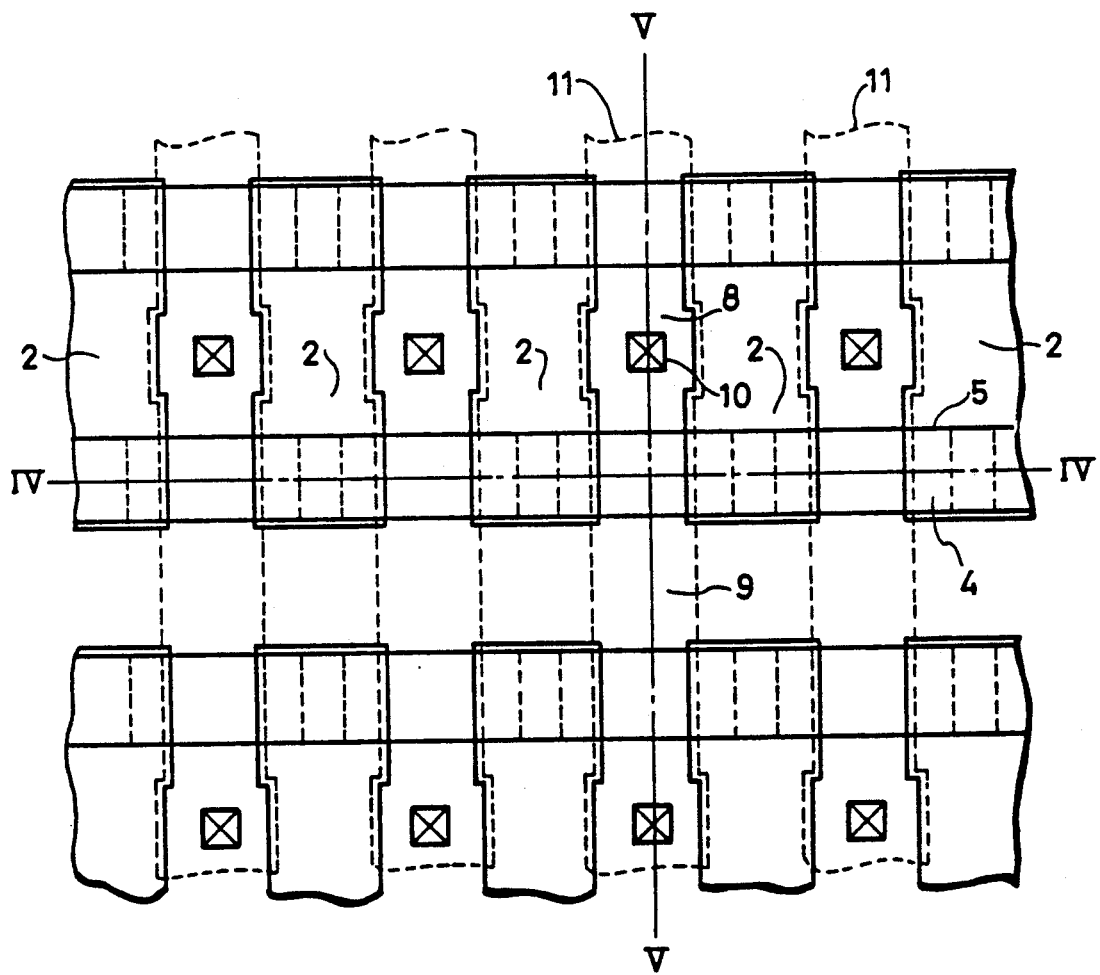
FIG. 3 is a fragmentary plan view of the prior art EPROM.
Figure 4:
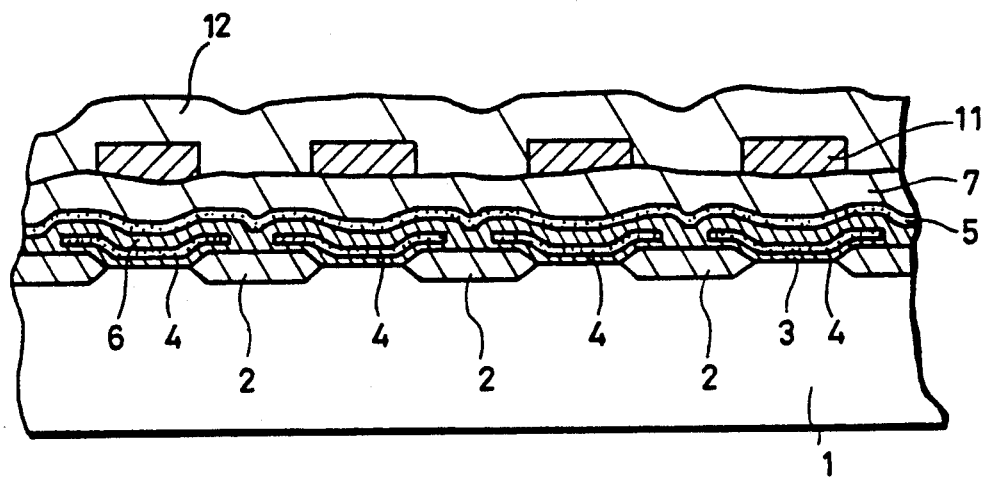
FIG. 4 is a cross-sectional view taken along the line IV—IV of FIG. 3.
Figure 5:
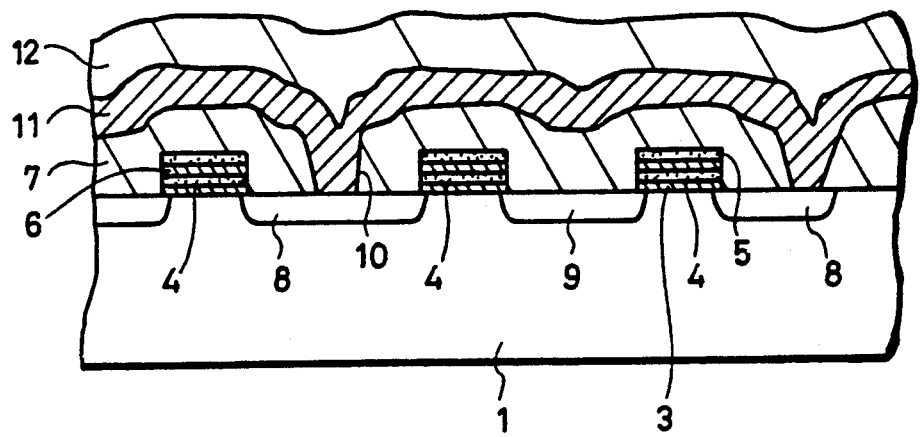
FIG. 5 is a cross-sectional view taken along the line V—V of FIG. 3.
Figure 6A:
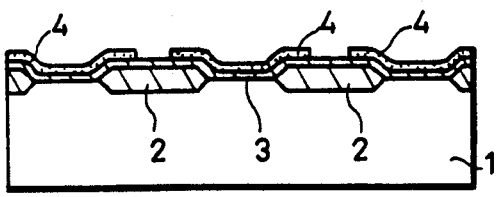
FIGS. 6A, 6B, 6C and 6D are cross-sectional views taken along the line IV—IV of FIG. 3 showing a process sequence for the method of manufacturing the prior art EPROM.
Figure 7A:
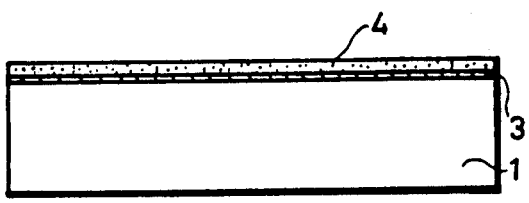
FIGS. 7A, 7B, 7C and 7D are cross-sectional views taken along the line V—V of FIG. 3 showing a process sequence for the method of manufacturing the prior art EPROM.
Figure 6B:
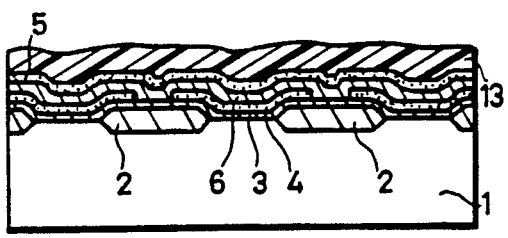
Figure 7B:
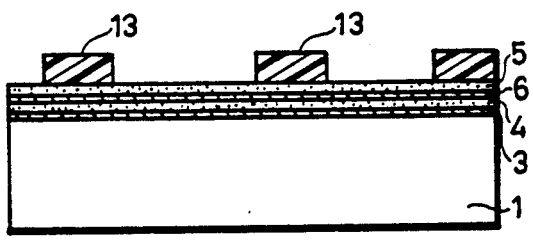
Figure 6C:
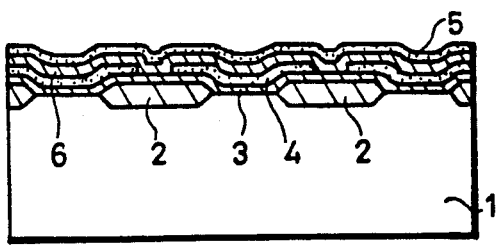
Figure 7C:
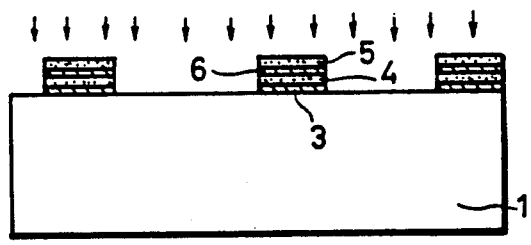
Figure 6D:
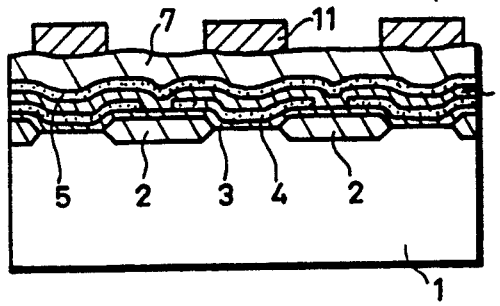
Figure 7D:
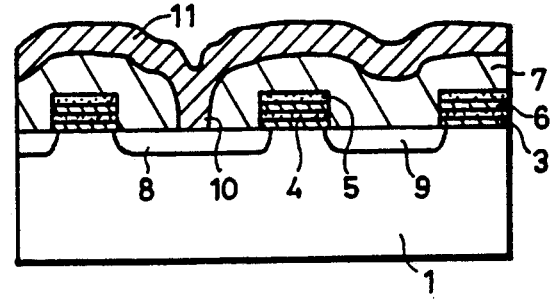
Figure 8:
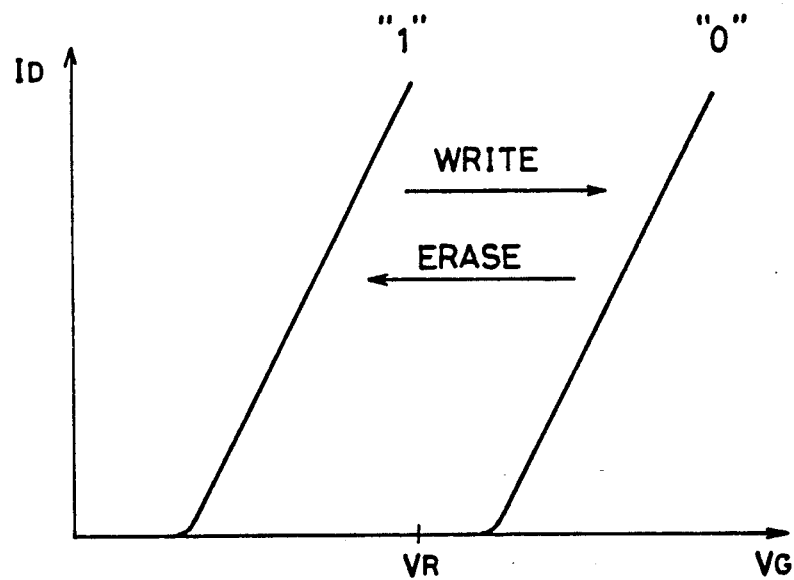
FIG. 8 is a graphic representation showing the relation between drain current $I_D$ and control gate voltage $V_G$ during read out of the EPROM.
Figure 9:
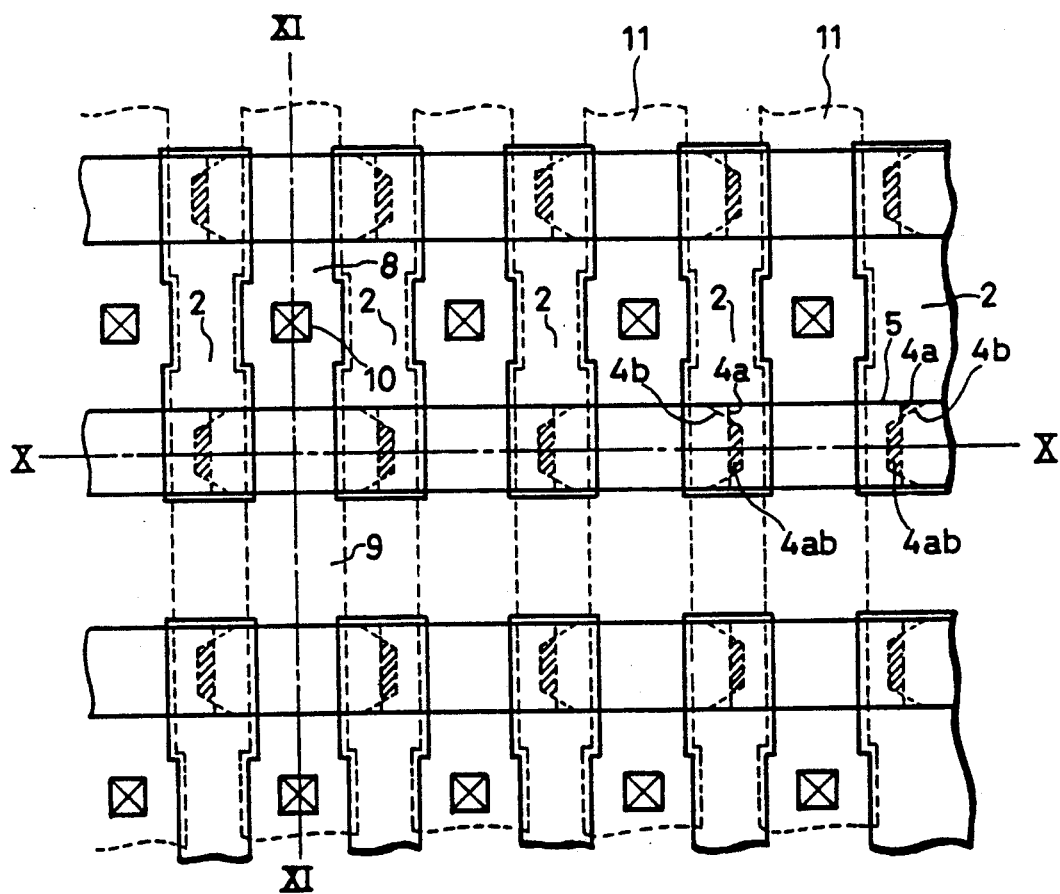
FIG. 9 is a fragmentary plan view of a EPROM in accordance with this invention.
Figure 10:
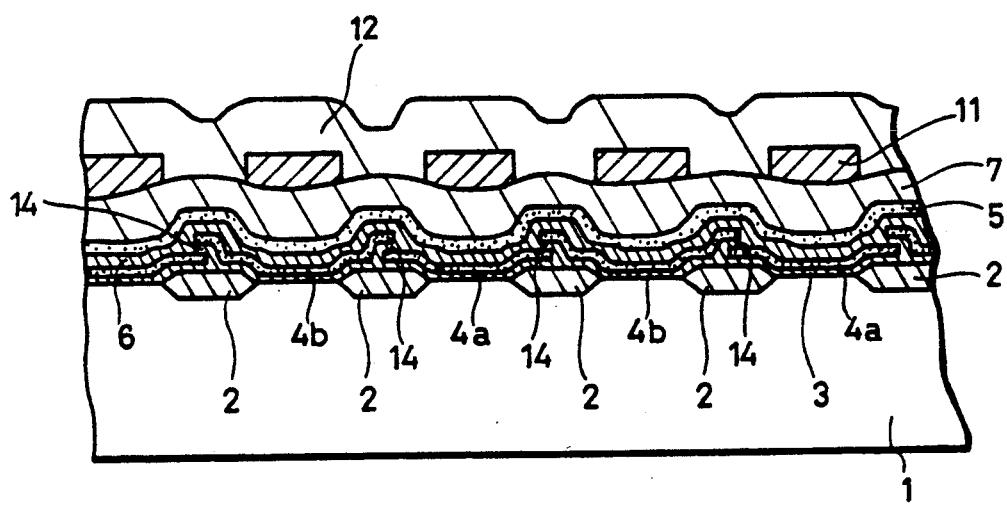
FIG. 10 is a cross-sectional view taken along the line X—X of FIG. 9.
Figure 11:
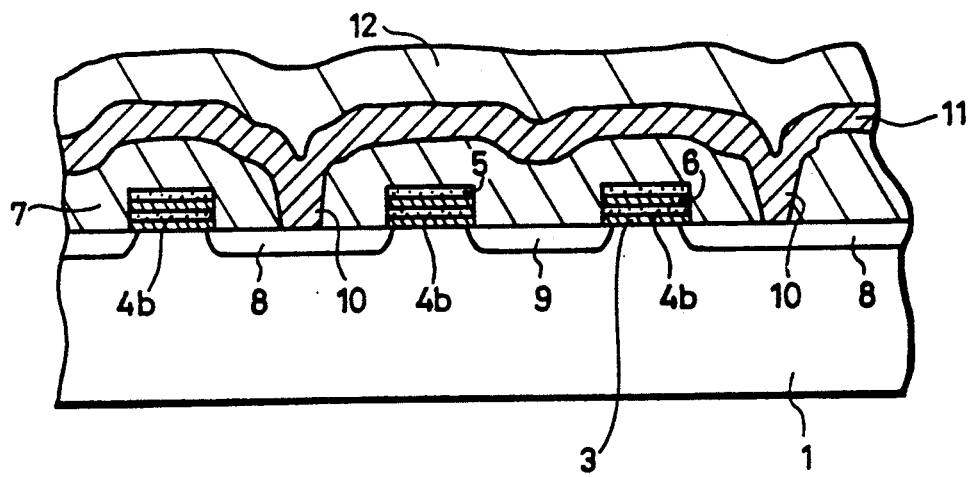
FIG. 11 is a cross-sectional view taken along the line XI—XI of FIG. 9.

Referring now to FIGS. 9-11, there is shown an EPROM in accordance with a preferred embodiment of this invention. The EPROM cell includes a plurality of field oxides layers 2 formed on a semiconductor substrate 1 and spaced away from another to isolate memory cells yet to be formed. Gate oxide layers 3 are provided on the semiconductor substrate 1 to extend along the line X—X and across the spaced-apart field oxide layers 2. A plurality of floating gates 4a and 4b are formed on each gate oxide layer 3 in an alternate arrangement. One important feature of this invention resides in the fact that adjacent floating gates 4a and 4b are arranged such that these floating gates 4a and 4b overlap or overlie each other at the opposite ends thereof with gate oxide layer 14 interposed between the opposite ends. Control gates strips 5 are formed over the floating gates 4a and 4b to extend along the line X—X. Another gate oxide layers 6 cover the floating gates 4a and 4b. The control gate strips 5 include a plurality of control gates which are interconnected with one another by the control gate strips. An insulating layer 7 covers the entire substrate including the control gate strips 5. Metal conductor layers 11 are deposited on the insulating layer 7 to extend along the line XI—XI and are spaced apart from one another. As can be seen in the cross section of FIG. 11, drain regions 8 and source regions 9 of the memory cell are formed alternately along the line X—X in the surface areas of the semiconductor substrate 1 between adjacent floating gates 4a (or 4b). Drain regions 8 make electrical connections to metal conductor strips 11 through contact holes 10 formed in insulating layer 7. In the plane view of FIG. 9, the drain regions 8 lie in the surface area surrounded by adjacent field oxide layers 2 and adjacent control gate strips 5, while the source region 9 extends along the line X—X between adjacent control gate strips 5 and it is to be shared by a plurality of memory cells. The metal conductor strips 11 on the insulating layer 7 are covered and protected by a glass coating (oxidation layer) 12.

As stated briefly above, the floating gates 4a and 4b provided beneath the control gate strips 5 are arranged side by side such that adjacent floating gates 4a and 4b partially overlap each other. More specifically, as shown in cross section in FIG. 10, adjacent floating gates 4a and 4b are arranged to overlap each other at their opposite ends with the remaining gate oxide layer 14 sandwiched between them. For this purpose, in the illustrated embodiment, the opposite end portions of the floating gate 4b are bent or turned upwardly away from the corresponding end portions of the adjacent floating gate 4a, thereby securing some vertical spacing or gap between the overlapping end portions of the floating gates 4a and 4b. The remaining gate oxide layer 14 stays and fills in the vertical spacing between the overlapping ends, thereby to electrically insulate the adjacent floating gates 4a and 4b from one another. The net result of this overlapping arrangement is that there exists no horizontal or lateral spacing between adjacent floating gates 4a and 4b as in the prior art. The necessary electrical insulation between the floating gate 4a and the floating gate 4b is provided by the vertical spacing or gap. The elimination of the horizontal spacing between the floating gates results in the reduced overall area or size of a cell and leads to a higher cell density of the memory device.

As shown in FIG. 10, the cross-sectional shape and size of floating gates 4a and 4b are different from one another. So are their overall shape and size which may give rise to undesired variations in operating characteristics among memory transistors having different floating gates. This possibility may be avoided, for example, by keeping the contact area between the control gate strip 5 and the floating gate 4a or 4b via the gate oxide layer 6 uniform for all floating gates 4a and 4b.

Referring now to FIGS. 12A-12E and FIGS. 13A-13E, the method for manufacturing the EPROM cell in accordance with this invention is described in detail.

Figure 12A:
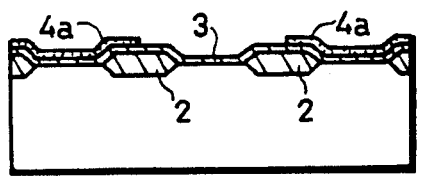
FIGS. 12A, 12B, 12C, 12D and 12E are partial cross-sectional views taken along the line X—X of FIG. 9 showing a process sequence for the method of manufacturing the EPROM in accordance with this invention.
Figure 13A:
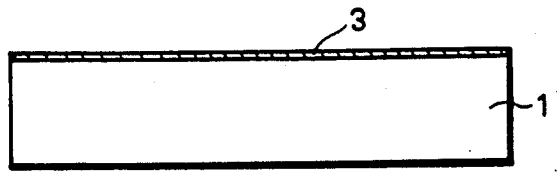
FIGS. 13A, 13B, 13C, 13D and 13E are partial cross-sectional views taken along the line XI—XI of FIG. 9 showing a process sequence for the method of manufacturing the EPROM in accordance with this invention.
Figure 13B:
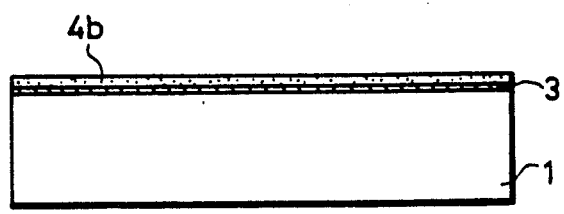

First, in FIGS. 12A and 13B, a plurality of field oxide layers 2 are formed on a P-type semiconductor substrate 1 by thermal oxidation so that they extend in the direction along the line XI—XI of FIG. 9 and are spaced apart from one another in the direction along X—X of FIG. 9. Then the whole upper surface of the semiconductor substrate including the filed oxide layers 2 is covered with a gate oxide layer 3, upon which a polycrystalline silicon layer (not shown) is grown by chemical vapor deposition. This polycrystalline silicon layer is selectively removed using mask and etching techniques to form a floating gate 4a alternately between the field oxide layers 2.

Figure 12B:
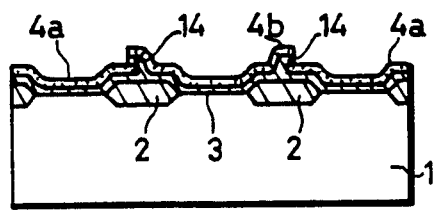

In FIG. 12B and FIG. 13B, after covering the semiconductor substrate 1 with a gate oxide layer 14, another polycrystalline silicon layer (not shown) is deposited on the gate oxide layer 14. The polycrystalline silicon layer is selectively removed using mask and etching techniques thereby to form floating gates 4b between adjacent floating gates 4a such that the opposite ends of each floating gate 4b overlap the ends of adjacent floating gates 4a in a manner as described above. Thereafter, the gate oxide layer 14 is etched away from over the floating gates 4a, leaving only portions thereof under the floating gates 4b.

Figure 12C:
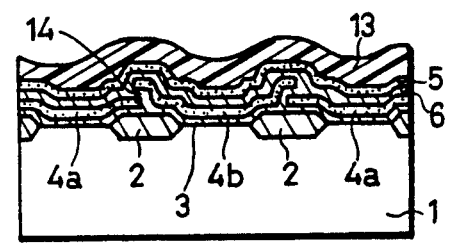
Figure 13C:
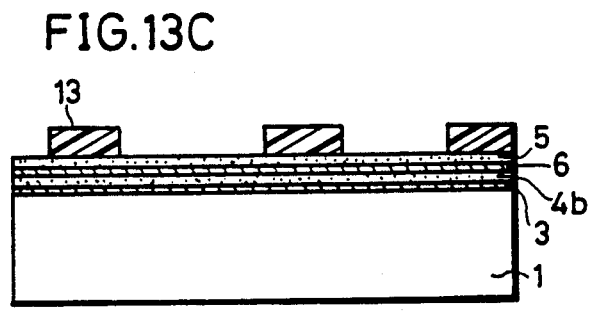

In FIGS. 12C and 13C, a gate oxide layer 6 is grown using chemical vapor deposition techniques, and on this gate oxide layer 6 still another layer of polycrystalline silicon (not shown) is deposited. A photoresist 13 is applied on the polysilicon layer in a predetermined pattern, and using this photoresist as a mask, the polysilicon layer is selectively etched to leave control gate strips 5 on the gate oxide layer 6. At the same time that the control gate strips 5 are formed, the floating gates 4a and 4b which underlie the control gate strips 5 are patterned in a self-alignment manner with the control gate strip 5 serving as a mask against the etchant. In 4b is designed to have a planar configuration with its four corners cut away as shown in FIG. 9. With this configuration, overlapped ends 4ab of the floating gates 4a and 4b do not extends laterally outwardly from beneath the control gate strip 5 into the area between the control gate strips 5. As a result, three layers of polycrystalline silicon (which comprise control gate strip 5 and floating gates 4a and 4b) are not concurrently removed in the procedure of manufacturing. Therefore, when the floating gates 4a and 4b are patterned in self-alignment manner using the control gate strips 5 as a mask and removing portion of the floating gate layers outside the control gate strips 5, only two layers of polysilicon have to be etched away, requiring no additional step or procedure for it.

Figure 14:
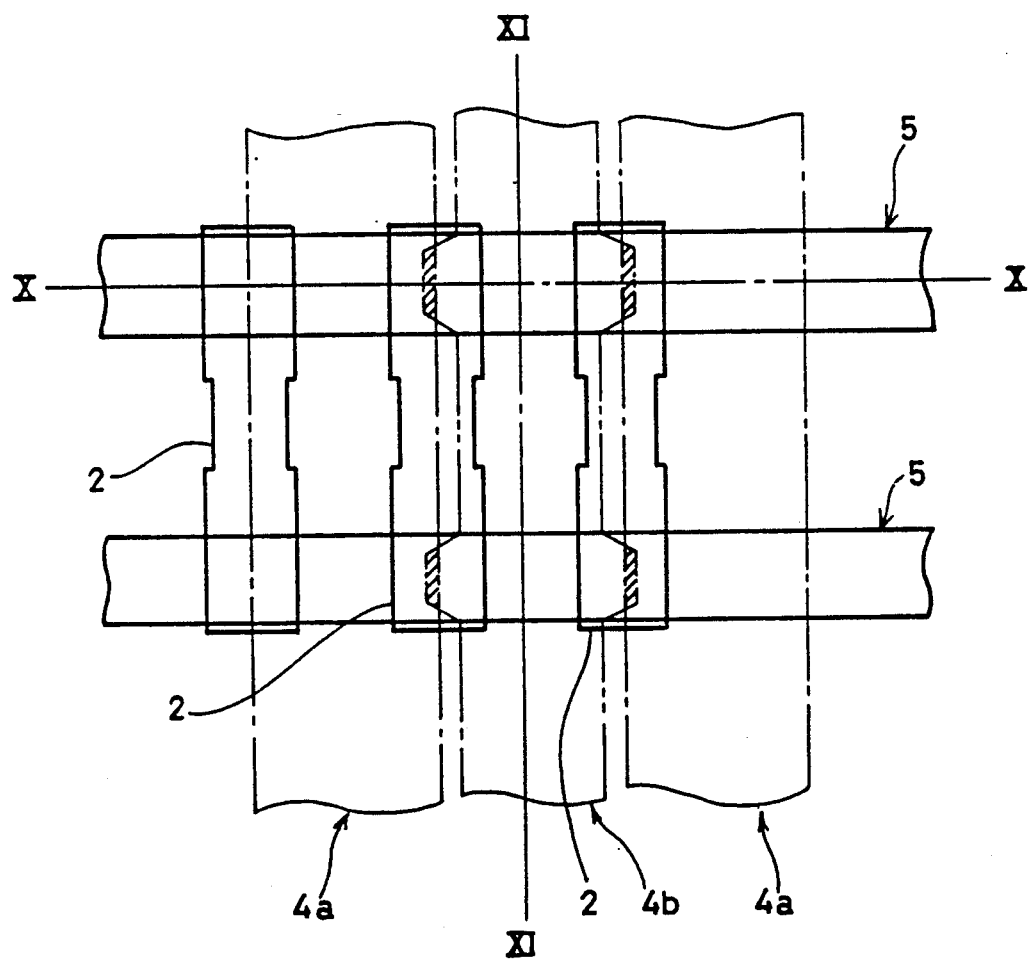
FIGS. 14 is a schematic plan view of the EPROM of 12B and 13B.

More specifically, as shown in FIG. 14 which schematically illustrate the plan view of the EPROM in the manufacturing step of FIGS. 12B and 13B, a first polysilicon layer is deposited on the substrate and it is selectively removed using mask and etching techniques to form floating gate layer or slip as indicated by 4a. Then a second polysilicon layer is deposited and selectively etched away to form a floating gate layer or strip 4b. A third polysilicon layer is similarly deposited and etched to form control gate strips 5. During this etching process of the third polysilicon layer, the first and second polysilicon layers comprising floating gate layers 4a and 4ba are also selectively etched with the control strips 5 serving as the mask. Thus, the portion of the first and second polysilicon layers exposed outside control gate strips 5 are removed, leaving the first and second polysilicon layers under the control gate strips intact to form discrete floating gates 4a and 4b. It should be pointed out that it is possible and easy to selectively etch two films or layers of polysilicon in a single processing step. But for the selective etching of three overlayed polysilicon layers, additional steps are needed. In this regard, in the memory cell of this invention, the first, second and third polysilicon layers form a triple-layer structure where the opposite ends of adjacent floating gates overlap one another as indicated by hatched portions in FIG. 14. But a triple-layered structure lies under the control gate strip 5 and is effectively masked by it. Thus, a triple-layered portions are not to be removed during etching of the control gate strip. In other words, the novel arrangement of the floating gates in accordance with this invention where the adjacent ends are overlappingly placed does not lead to a complicated modification of the usual process for manufacturing the memory cell.

Figure 12D:
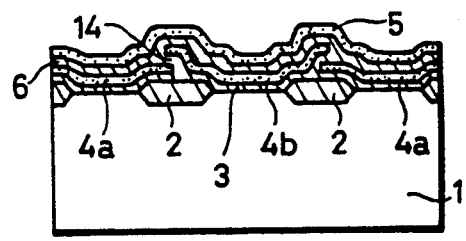
Figure 13D:
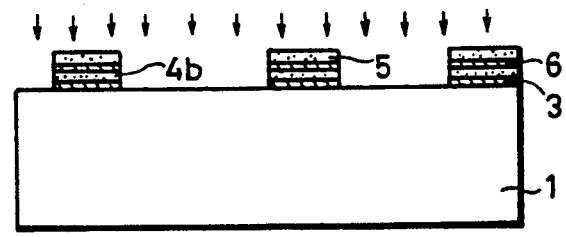

In FIGS. 12D and 13D, after removing the photoresist 13, arsenic ion implantation is carried out in the direction indicated by the arrows using the control gate strips 5 as the mask. This ion implantation forms N-type drain region 8 and N-type source region 9 in the major surface of the substrate 1.

Figure 12E:
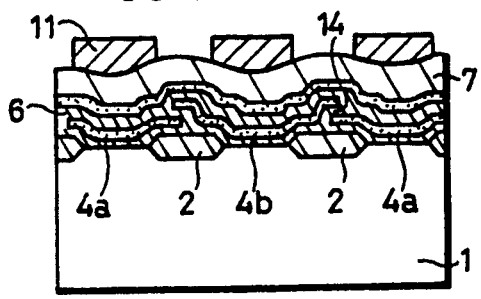
Figure 13E:
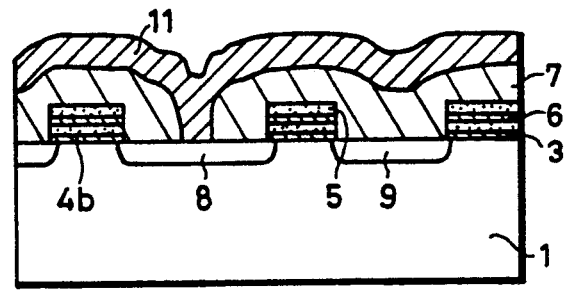

In FIGS. 12E and 13E, an insulating layer 7 is grown on the substrate by chemical vapor deposition, after which contact holes 10 are made to extend to the drain region 8 using dry etching techniques. A metal conductor layer 11 having a predetermined desired circuit pattern is formed on the insulating layer 7 and it electrically connects to the drain region 8 through the contact hole 10. As a final step a glass coating is produced, covering the entire surface and completing an EPROM cell array shown in FIGS. 9-11.

As described in detail hereinabove, in the EPROM made according to this invention, floating gates 4a and 4b are formed and arranged side by side under the control gate strip 5 such that adjacent floating gates overlaps one another at the opposite ends, keeping some vertical spacing or gap between the overlapped ends of the floating gates. And the gate oxide layer 14 fills in the vertical spacing. With this unique arrangement of the floating gates, the horizontal spacing between adjacent floating gates which was found in the prior art has effectively eliminated without causing any electrical contact between them due to the presence of the gate oxide layer 14. The absence of the horizontal gap or spacing between the floating gates results in a reduction in overall area or size of the individual memory cell, which, in turn, permits a much improved cell density in the EPROM of this invention without impairing its operational characteristics.

While the invention has been described as embodied in the EPROM as a nonvolatile semiconductor memory device, this invention also can be effectively embodied in other types of memory devices having a floating gates therein such as electrically erasable programmable read only memories (EEPROMs).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a semiconductor substrate having pairs of source/drain regions formed in a major surface thereof;
   a first insulating layer formed on said major surface of said substrate;
   a plurality of floating gates formed on said first insulating layer having portions which overlap one another with an insulating film interposed therebetween, wherein each of said floating gates serves as a gate electrode adjacent one pair of the source/drain regions;
   a second insulating layer formed on said floating gates; and
   a control gate formed on said second insulating layer;
   wherein each source/drain pair together with the corresponding floating gate and a portion of the control gate form a cell of the memory device.

* * * * *